(12) United States Patent
Hassan

(10) Patent No.: US 8,217,814 B1
(45) Date of Patent: Jul. 10, 2012

(54) LOW POWER SERIAL TO PARALLEL CONVERTER

(75) Inventor: Mahmudul Hassan, San Carlos, CA (US)

(73) Assignee: MoSys, Inc., Santa Clara, CA (US)

( * ) Notice: Subject to any disclaimer, the term of this patent is extended or adjusted under 35 U.S.C. 154(b) by 18 days.

(21) Appl. No.: 12/971,847

(22) Filed: Dec. 17, 2010

(51) Int. Cl.
*H03M 9/00* (2006.01)

(52) U.S. Cl. .................................. 341/100; 341/101

(58) Field of Classification Search .......... 341/100, 341/101; 327/407, 408, 411; 365/189.02, 365/219, 220
See application file for complete search history.

(56) References Cited

U.S. PATENT DOCUMENTS

| 5,561,423 A | 10/1996 | Morisaki |
| 6,768,431 B2 | 7/2004 | Chiang |
| 7,764,206 B2 * | 7/2010 | Morzano et al. ............ 341/101 |

* cited by examiner

*Primary Examiner* — Joseph Lauture
(74) *Attorney, Agent, or Firm* — MHKKG

(57) ABSTRACT

A serial-to-parallel converter includes a sampling unit that may, in response to a serial clock signal, sample a serial data stream and provide an even serial data stream, and an odd serial data stream. The serial-to-parallel converter also includes a strobe generator and a number of latches. The strobe generator generates a plurality of enable signals based upon the serial clock signal. The frequency of a given enable signal corresponds to a fractional multiple of a frequency of the serial clock signal. In response to a particular respective enable signal, each of a first portion of the latches may latch and output a particular respective even data bit. Each of a second portion of the latches may latch and output a particular respective odd data bit. The serial-to-parallel converter further includes a number of output flip-flops to output the data bits in parallel in response to an output clock signal.

20 Claims, 5 Drawing Sheets

LOW POWER SERIAL TO PARALLEL CONVERTER

BACKGROUND

1. Technical Field

This disclosure relates to data conversion, and more particularly to serial to parallel conversion.

2. Description of the Related Art

Systems that employ communication links with serializer-deserializer (SerDes)-based interconnects typically require receiver circuitry to serialize and deserialize the data between serial and parallel data formats. Many systems are now employing serial links to transfer data at speeds in the tens of Gb/sec and beyond. To deserialize the data, a serial-to-parallel converter is used. As shown in FIG. 1, a conventional serial-to-parallel converter uses a significant number of high-speed flip-flop circuits and a corresponding high-speed clock tree to capture the serial data and convert it to parallel data within the device. However, at these speeds, power consumption may be an issue.

More particularly, conventional serial-to-parallel converters may use a number of high-speed flip-flops to capture the serial data and convert it to parallel data using a high-speed clock. An example of such a conventional serial-to-parallel converter is shown in FIG. 1. The serial-to-parallel converter 10 of FIG. 1 receives a serial data stream sdata_in at a pair of one-bit analog-to-digital (A/D) converters (e.g., 11 and 12). The A/D converters 11 and 12 sample the serial data at the clock rate specified by the clock signal clk_in. The A/D 11 captures the serial data on the rising or positive edge of clk_in while the A/D 12 captures the serial data on the falling or negative edge of clk_in. In the embodiment shown in FIG. 1, even data (e.g., bits 0, 2, 4, 6, etc.) is captured on the rising edge and odd data (e.g., bits 1, 3, 5, 7, etc.) is captured on the falling edge of the high-speed clock signal clk_in. Accordingly the flip-flop (FF) 17 captures the even serial data bits that were sampled by the A/D 11 and the FF 18 captures the odd serial data bits that were sampled by the A/D 12 to remove the half-cycle data caused by sampling on the rising and falling edges of clk_in. In addition, each of the FF 19-FF26 captures the respective bits of an eight-bit byte using the buffered (via clock buffer 13) high-speed clock signal clk_in to create an eight-bit parallel data byte. For example, bits zero, two, four, and six may be captured by FFs 19, 20, 21, and 22, respectively, while bits one, three, five, and seven may be captured by FFs 23, 24, 25, and 26, respectively. As shown, the FF19-FF26 are enabled by strobe signals rxen<7:0> only during the time in which the respective data bits should be present. The strobe signals rxen<7:0> are generated by the strobe generator 15 based upon the clk_in signal. Each captured bit passes through a respective exclusive-OR (XOR) gate (e.g., XOR gates 27-34) and when selected the polarity is inverted. The parallel data (e.g., rxdata<7:0>) is then captured by the output flip-flops (e.g., FF 35-FF42) using the slower clock signal clkdiv4, which may be running at one-fourth the frequency of the clk_in signal. The clkdiv4 signal is generated by the clock generator 16, which receives the buffered clk_in signal through clock buffer 14.

The serial-to-parallel converter 10 has many high-speed flip-flops and although only one high-speed clock buffer/driver 13 is shown, it is representative of many such drivers and/or the RC time constants of the wiring in the clock tree that distributes the high-speed clock to the high-speed FF19-FF26. As such, the serial-to-parallel converter 10 of FIG. 1 may consume an unacceptable amount of power at high speeds. Furthermore, it may be desirable to use less overall area when fabricated as an integrated circuit.

SUMMARY OF THE EMBODIMENTS

Various embodiments of a serial-to-parallel converter are disclosed. In one embodiment, the serial-to-parallel converter includes a sampling unit that may, in response to a serial clock signal, sample an input serial data stream having even and odd data bits, provide an even serial data stream including the even data bits, and provide an odd serial data stream including the odd data bits. The serial-to-parallel converter also includes a strobe generator and a number of latches. The strobe generator may be configured to receive the serial clock signal and to generate a plurality of enable signals based upon the serial clock signal. The frequency of a given enable signal corresponds to a fractional multiple of a frequency of the serial clock signal. For example, the enable strobes may operate at one-fourth the frequency of the serial clock signal. The latches may latch the even data bits and the odd data bits, and in response to a particular respective enable signal, each of a first portion of the latches may be configured to latch and output a particular respective even data bit. Each of a second portion of the latches may be configured to latch and output a particular respective odd data bit. The serial-to-parallel converter further includes a number of output flip-flops, each configured to capture and output the particular respective data bit output by the respective latch in response to an output clock signal.

In one specific implementation, the serial-to-parallel converter also includes a first serial flip-flop and a second serial flip-flop that may capture and output the even data bits and the odd data bits, respectively, in response to a rising edge of the serial clock signal.

In another specific implementation, the serial-to-parallel converter also includes a first exclusive-OR (XOR) gate coupled between the first serial flip-flop and the first portion of the plurality of latches and may be configured to invert a polarity of the even data bits dependent upon an inversion select signal. The serial-to-parallel converter also includes a second XOR gate coupled between the second serial flip-flop and the second portion of the plurality of latches and configured to invert a polarity of the odd data bits dependent upon the inversion select signal.

Figure 1:
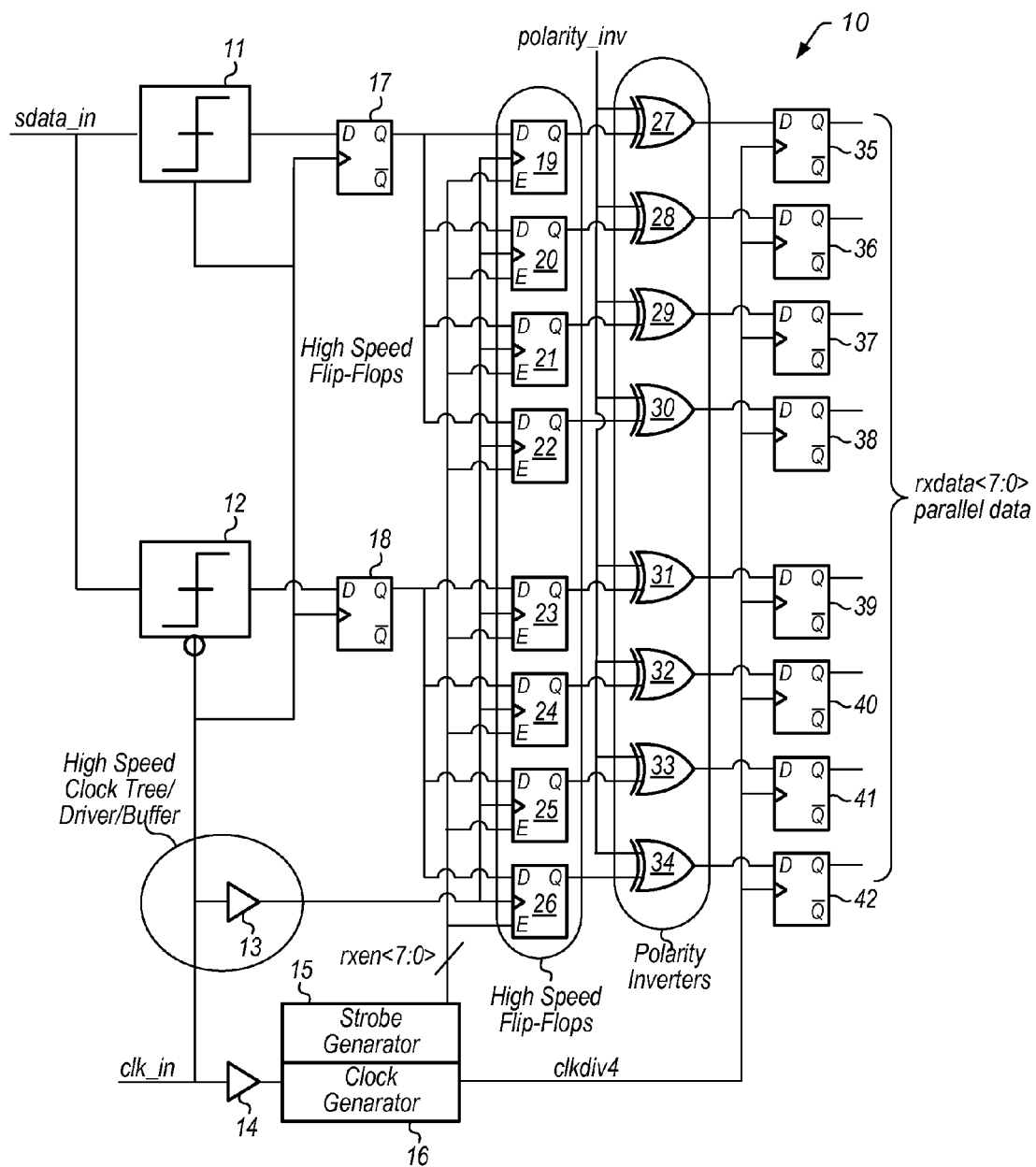
FIG. 1 is a schematic diagram of a prior art serial-to-parallel converter.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure.

Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

DETAILED DESCRIPTION OF THE EMBODIMENTS

Figure 2:
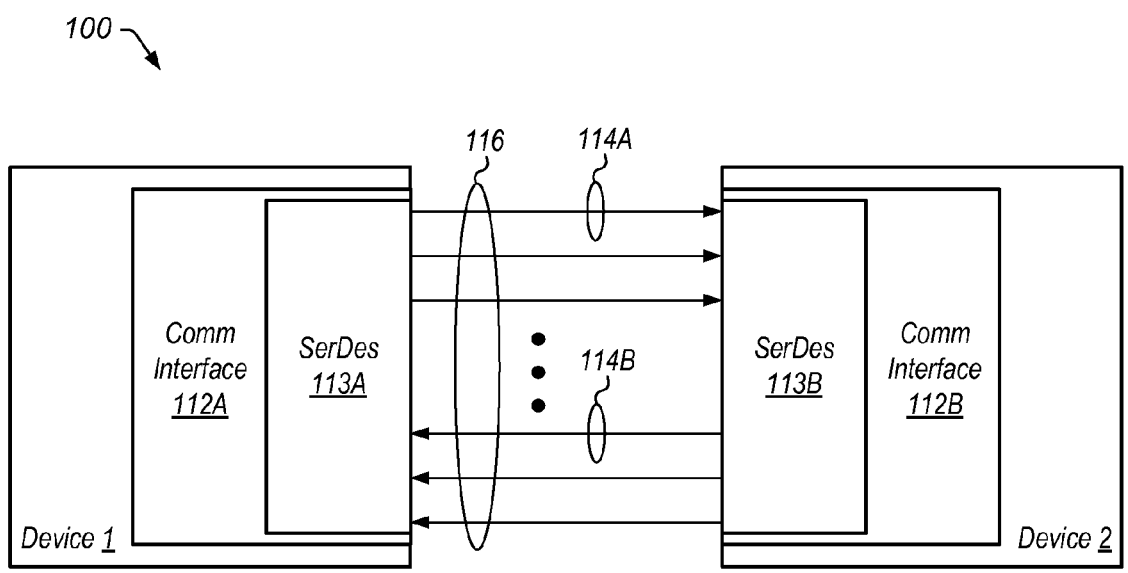
FIG. 2 is a block diagram of one embodiment of a system including a communication link between two devices.

Turning now to FIG. 2, a block diagram of one embodiment of a system including a communication link between two devices is shown. The system 100 includes a device (e.g., device 1) coupled to another device (e.g., device 2) via a serial communication link 116. Device 1 includes a communication interface 12A, and device 2 includes a communication interface 112B. In addition, communication interface 112A includes a SerDes 113A and communication interface 112B includes a SerDes 113B. Generally speaking, each of the devices 1 and 2 may embody any type of apparatus and implement any particular functionality, as desired. As such, circuitry implementing each of devices 1 and 2 or aspects thereof may be incorporated on a single integrated circuit (IC) or on different ICs. In one exemplary embodiment, one device (e.g., device 1) may be representative of a memory controller, and the other device (e.g., device 2) may be representative of a memory device.

It is noted that a communication link such as communication link 116 refers to the physical interconnect, whether wired or wireless, between two devices for conveying information. For example, in one embodiment in which two integrated circuit (IC) chips mounted on a circuit board are interconnected via a wired communication link, the communication link may include any number of wire traces on the circuit board. Accordingly, in the embodiment shown in FIG. 2, the communication link 116 includes unidirectional communication paths (e.g. 114A) that convey information serially from device 1 to device 2, and unidirectional communication paths (e.g. 114B) that convey information serially from device 2 to device 1. It is noted that in various embodiments, there may be any number of unidirectional communication paths 114A and 114B within the serial communication link 116. However, it is also noted that in other embodiments the communication link 116 may instead include any number of bidirectional serial communication paths. Alternatively, communication link 116 may include both unidirectional and bidirectional serial communication paths.

As described in greater detail below in conjunction with the description of FIG. 3, in one embodiment, each SerDes 113 may include a serial-to-parallel converter (shown in FIG. 3) for converting serial data from the communication link 116 to parallel data that may be used within the SerDes 113 of device 1 and device 2 in general. More particularly, in one embodiment the serial-to-parallel converter of FIG. 3 may consume less power and area than some conventional converters (e.g., serial-to-parallel converter 10 of FIG. 1) by replacing several high-speed flip-flops with latches, eliminating many polarity inverting gates, and eliminating a portion of the high-speed clock tree associated with distributing the high-speed clock to the eliminated flip-flops.

Figure 3:
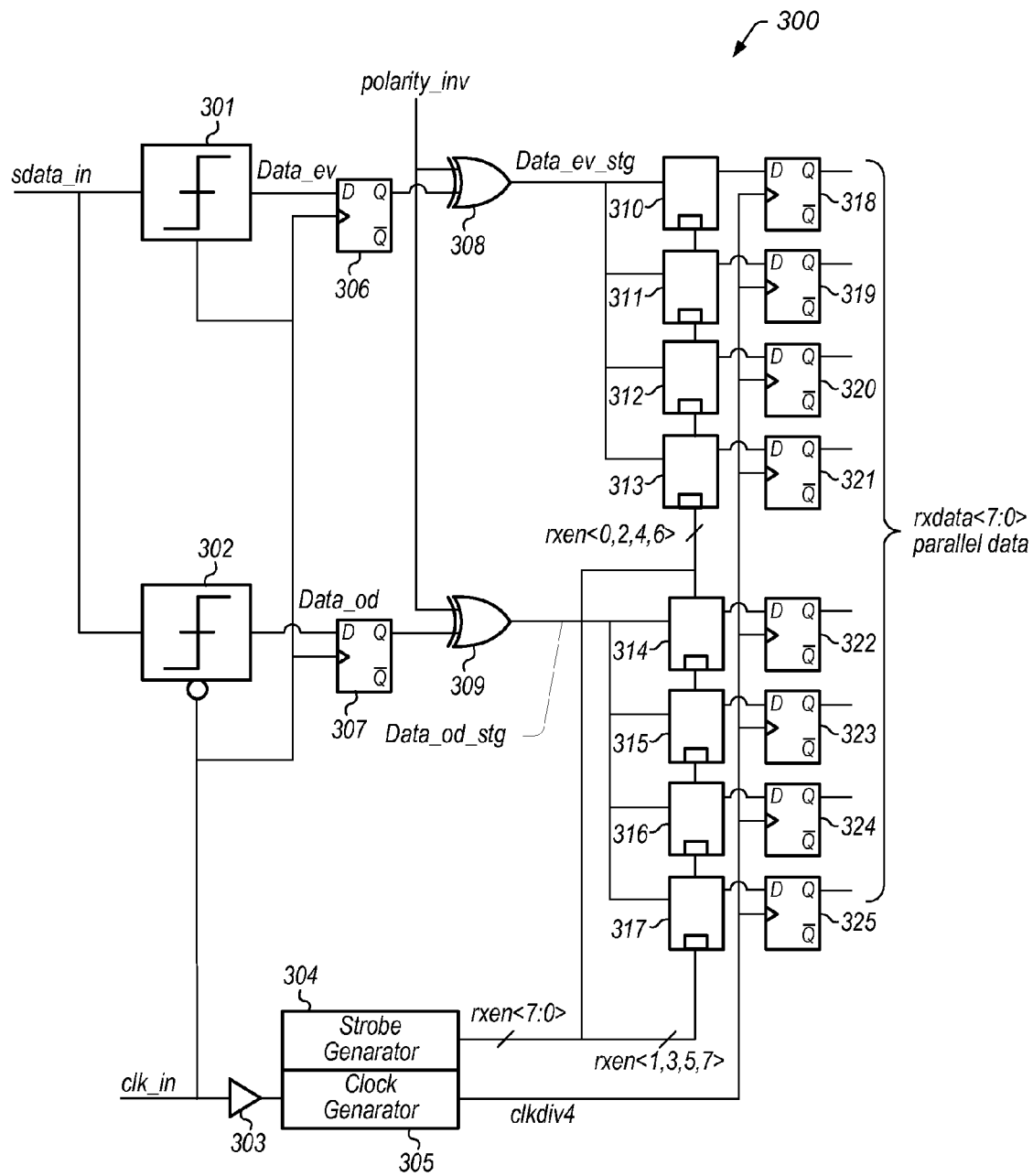
FIG. 3 is a schematic diagram of one embodiment of a low power serial-to-parallel converter.

Referring to FIG. 3, a schematic diagram of one embodiment of a serial-to-parallel converter is shown. Similar to the serial-to-parallel converter 10 of FIG. 1 the serial-to-parallel converter 300 of FIG. 3 receives a serial data stream sdata_in at a pair of sampling devices such as one-bit analog-to-digital (A/D) converters (e.g., 301 and 302), which embody a sampling unit. The serial data stream sdata_in is operating at a particular baud (i.e. symbol) rate, and has a corresponding switching frequency. The A/D converters 301 and 302 sample the serial data at the clock rate (i.e., clock frequency) specified by the clock signal clk_in. In one embodiment, the clock frequency of the clk_in signal is substantially the same as the switching frequency of the sdata_in, and substantially half of the baud rate of the sdata_in stream. For example, if the serial data stream is operating with a baud rate of 10 Gbps, it has a switching frequency of 5 Ghz, and the clk_in signal may also be operating at 5 Ghz. To keep the clk_in signal frequency low, the A/D 301 captures the serial data on the rising or positive edge of clk_in while the A/D 302 captures the serial data on the falling or negative edge of clk_in. The flip-flop (FF) 306 captures the even serial data bits that were sampled by the A/D 301 and the FF 307 captures the odd serial data bits that were sampled by the A/D 302 using the high-speed clock signal clk_in. The FF306 and FF307 remove the half-cycle data caused by sampling on the rising and falling edges of clk_in and allow all data to be timed with the one (e.g., rising edge) of the clk_in signal.

However, instead of capturing the serial data using eight high-speed flip-flops and a high-speed clock as shown in FIG. 1, the serial-to-parallel converter 300 of FIG. 3 uses latches 310-317 to capture the respective bits of an eight-bit byte. In addition, instead of the high-speed clock (e.g., clk_in), latches 310-317 use the strobe signals rxen<7:0> which operate at a frequency that is lower than the clk_in signal, to latch the data bits, thus saving power and area. For example, bits zero, two, four, and six may be captured by latches 310, 311, 312, and 313, respectively, while bits one, three, five, and seven may be captured by latches 314, 315, 316, and 317, respectively. As shown in the timing diagram of FIG. 4, each of the latches 310-317 is enabled by one of the strobe signals rxen<7:0> only during the time in which the respective data bit should be present. In one embodiment, although the strobe signals rxen<7:0>, in FIG. 3 are shown such that strobes rxen<0, 2, 46> are coupled to latches 310-313, and strobes rxen<1, 3, 5, 7> are coupled to latches 314-317, the actual strobe signals may be duplicated. For example, the actual strobe signals that are conveyed on rxen<0, 2, 46> may be the same signals as those conveyed on rxen<1, 3, 5, 7>, respectively. Thus, in various embodiments, the strobe generator may generate a separate strobe for each latch, or it may generate one strobe for two latches, as desired. Prior to latching the serial data into the latches 310-317, each captured serial stream (e.g., data_ev and data_od) passes through an exclusive-OR (XOR) gate (e.g., XOR gates 308 and 309) and when selected by the polarity_inv signal, the polarity is inverted. The strobe signals are generated by the strobe generator 304 based upon the buffered clk_in signal. The parallel data (e.g., rxdata<7:0>) is then captured by the output flip-flops (e.g., FF 318-FF325) using the slower clock signal clkdiv4, which in one embodiment, may be running at one-fourth the frequency of the clk_in signal. The clkdiv4 signal is generated by the clock generator 305, which receives the buffered clk_in signal through clock buffer 303. The operation of the serial to-parallel converter 300 is described in more detail with reference to the timing diagram of FIG. 4.

Figure 4:
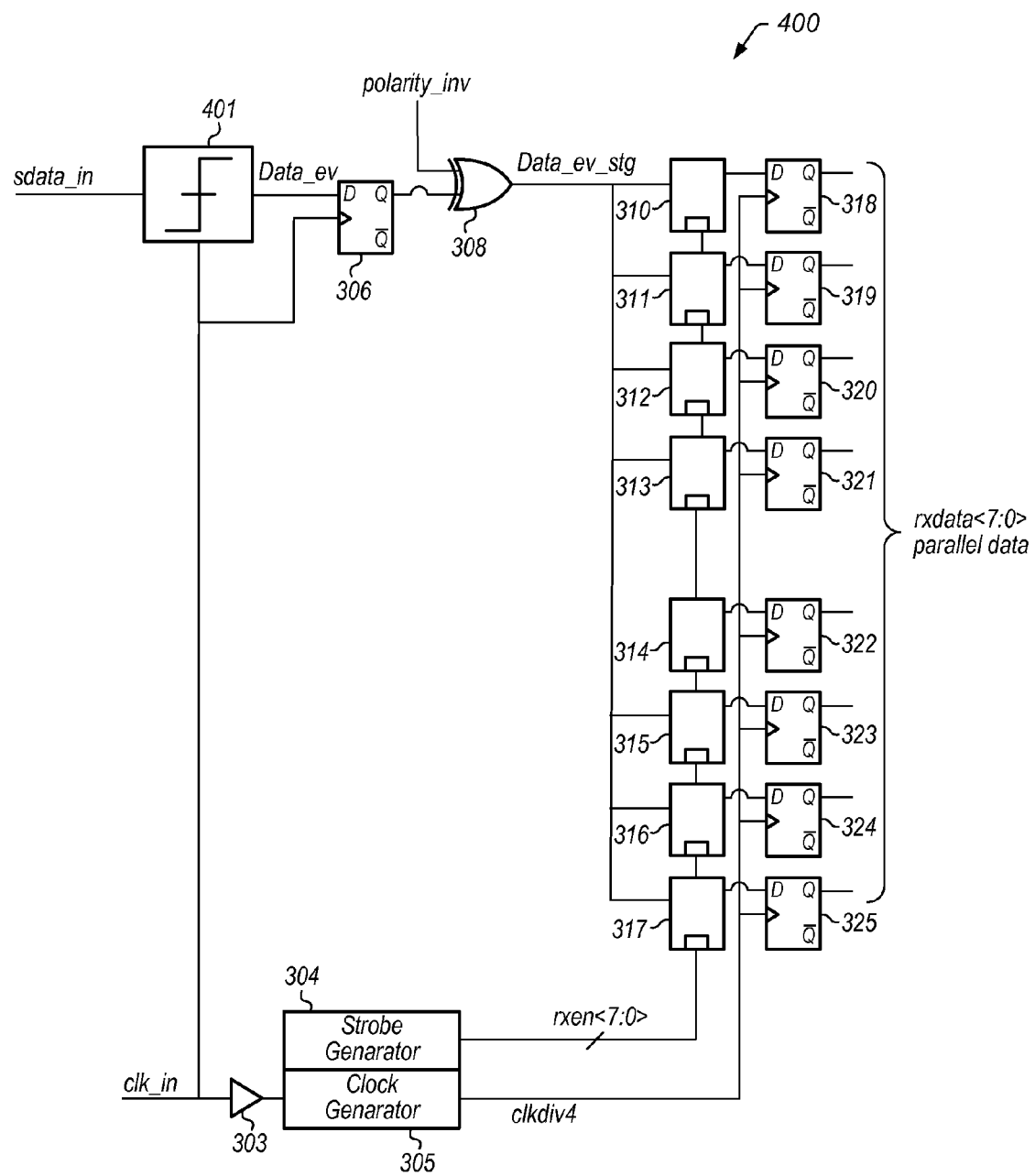
FIG. 4 is a schematic diagram of another embodiment of a low power serial-to-parallel converter.

In an alternative embodiment, rather than use two sampling A/D converters as shown in FIG. 3, a single sampling A/D (e.g., 401) may be used. An exemplary alternative embodiment is shown in FIG. 4. In the embodiment of FIG. 4, the serial clock clk_in signal has a frequency that is twice the maximum switching frequency of the sdata_in serial data stream. In addition, there is only one serial flip-flop (e.g., FF306) to capture and output the data bits of the serial data stream, and one polarity inversion XOR gate (e.g., 308). The remainder of the circuit components is similar to that shown in FIG. 3, and are thus numbered the same for clarity and simplicity. However, the strobe timing of rxen<7:0> in the embodiment of FIG. 4 may be different than that shown in FIG. 3. More particularly, in such an alternative embodiment, a separate enable strobe would drive each latch at the appropriate time to latch the respective date bits.

Figure 5:
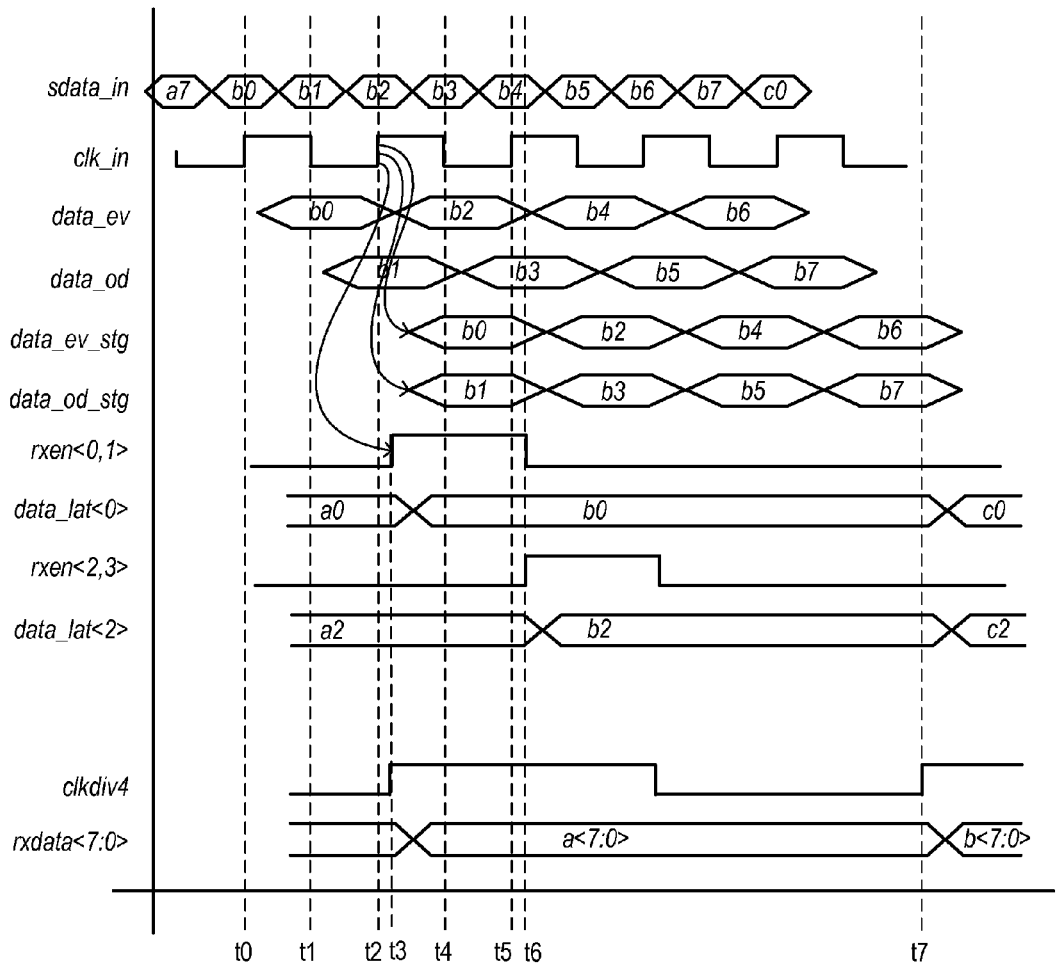
FIG. 5 is a timing diagram depicting the operational timing of one embodiment of the serial-to-parallel converter shown in FIG. 3

Turning to FIG. 5, a timing diagram depicting the operational timing of various signals of one embodiment of the serial-to-parallel converter shown in FIG. 3. The timing diagram includes a number of signals including sdata_in at the top, followed by the clk_in signal. Next the data_ev and data_od signals, which represent the even and odd data serial data streams after being sampled by the A/D converters 301 and 302, respectively, are shown. Next the data_ev_stg and data_od_stg signals, which represent the even and odd serial data streams after passing through the polarity inverting XOR gates 308 and 309, respectively, are shown. The next signal is the rxen<0,1> strobe which may be used to latch data in the latches 310 and 314, respectively. The next signal is the data_lat<0>, which may be the data latched by latch 310. The next signal is the rxen<2,3> strobe, which may be used to latch data in the latches 311 and 315, respectively. The next signal is the data_lat<2>, which may be the data that is latched by latch 311. The remaining strobes (e.g., rxen<4:7>) and latched data have been omitted here for simplicity. The next signal is the clkdiv4 signal, followed by the rxdata<7:0> signals.

Referring collectively to FIG. 3 and FIG. 5, as streaming serial data sdata_in is received, the clk_in signal clocks the A/D converters 301 and 302. At time t0 and t1, the A/D converters 301 and 302 capture the data bits b0 and b1 of the serial stream, respectively. As shown, the clk_in signal is operating at a frequency that is substantially the same as the switching frequency of the sdata_in data stream. As a result, the serial data streams data_ev and data_od leave the A/D converters 301 and 302, respectively, at substantially half the frequency and aligned to the clk_in signal. At time t2 and as shown by the arrows, both the FF306 and the FF307 capture the data bits b0 and b1 according to the leading edge of the clk_in signal. Thus, the bits of the serial data streams data_ev_stg and data_od_stg are in phase.

More particularly, at t2 the rising edge of clk_in captures both the b0 data bit and the b1 data bit. After a clock to q delay of the FF306 and FF307 and the delays of the XOR gates 308 and 309, the data bits of the streams data_ev_stg and data_od_stg appear at the input of latches 310-317 at substantially the same time. Also at t2, the strobe generator 305 generates the rxen<0,1> signal and at t3 the latches 310 and 314 latch the data bits b0 and b1, respectively, as shown by the data_lat<0> signal in which the data bit b0 is latched.

Similarly, at time t2 and t4 the A/D converters 301 and 302 capture the data bits b2 and b3, and at t5 the b2 and b3 data bits are captured by the FF306 and FF307. Accordingly, the b2 and b3 data bits appear at the input of latches 310-317. At t5, the strobe generator 305 generates the rxen<2,3> signal and at t6 the latches 311 and 315 latch the data bits b2 and b3, respectively, as shown by the data_lat<2> signal in which the data bit b2 is latched. It is noted that although not shown, the remaining strobes and latches operate similarly.

The clkdiv4 signal is an output clock used to capture and output the parallel data within the flip-flops FF318-FF325. Accordingly, at time t2, the output data from the previous data (e.g., a<7:0>) is captured and output on the rxdata<7:0> signal lines. Then at time t7, the output data (e.g., b<7:0>) is captured and output on the rxdata<7:0> signal lines. It is noted that the signals shown in FIG. 4 are not necessarily drawn to scale but are shown as they are for discussion purposes only.

It is noted that although the serial data stream is converted to an eight-bit parallel data byte, it is contemplated that in other embodiments, the serial data stream may be converted to a parallel word containing any number of bits as desired. It is also noted that in the above description, particular latches have been assigned to particular data bits, and particular A/D converters have been assigned as positive edge or negative edge triggered for discussion purposes only. It is contemplated that in other embodiments, any latch may be assigned to any data bit, and either A/D converter may be assigned to capture the even or odd bits as desired.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus, comprising:
   a sampling unit configured to, in response to a serial clock signal, sample an input serial data stream having even and odd data bits, provide an even serial data stream including the even data bits, and provide an odd serial data stream including the odd data bits;
   a strobe generator configured to receive the serial clock signal and to generate a plurality of enable signals based upon the serial clock signal, wherein a frequency of a given enable signal corresponds to a fractional multiple of a frequency of the serial clock signal;
   a plurality of latches coupled to the sampling unit and configured to latch the even data bits and the odd data bits;
   wherein in response to a particular respective enable signal, each of a first portion of the plurality of latches is configured to latch and output a particular respective even data bit, and each of a second portion of the plurality of latches is configured to latch and output a particular respective odd data bit;
   a plurality of output flip-flops, each coupled to a respective latch and configured to capture and output the particular respective data bit output by the respective latch in response to an output clock signal.

2. The apparatus as recited in claim 1, wherein the serial clock signal has an operating frequency that is slower than a baud rate of the input serial data stream.

3. The apparatus as recited in claim 1, further comprising a clock generator configured to generate the output clock to have a frequency that corresponds to a fractional multiple of the frequency of the serial clock signal.

4. The apparatus as recited in claim 1, wherein the sampling unit comprises a first sampling device and a second sampling device, wherein the first sampling device is configured to sample the input serial data stream in response to a rising edge of the serial clock signal, and wherein the a second sampling device is configured to sample the input serial data stream in response to a falling edge of the serial clock signal.

5. The apparatus as recited in claim 1, further comprising a first serial flip-flop and a second serial flip-flop configured to capture and output the even data bits and the odd data bits, respectively, in response to a rising edge of the serial clock signal.

6. The apparatus as recited in claim 5, further comprising a first exclusive-OR (XOR) gate coupled between the first serial flip-flop and the first portion of the plurality of latches and configured to invert a polarity of the even data bits dependent upon an inversion select signal, and a second XOR gate coupled between the second serial flip-flop and the second portion of the plurality of latches and configured to invert a polarity of the odd data bits dependent upon the inversion select signal.

7. An apparatus, comprising:
a sampling unit configured to, in response to a serial clock signal, sample an input serial data stream including a plurality of data bits and provide a serial data stream;
a strobe generator configured to receive the serial clock signal and to generate a plurality of enable signals based upon the serial clock signal, wherein a frequency of a given enable signal corresponds to a fractional multiple of a frequency of the serial clock signal;
wherein in response to a particular respective enable signal, each of a plurality of latches is configured to latch and output a particular respective data bit;
a plurality of output flip-flops, each coupled to a respective latch and configured to capture and output the particular respective data bit output by the respective latch in response to an output clock signal.

8. The apparatus as recited in claim 7, wherein the serial clock signal has an operating frequency that is substantially the same as a baud rate of the input serial data stream.

9. The apparatus as recited in claim 7, further comprising a serial flip-flop configured to capture and output the data bits in response to a rising edge of the serial clock signal.

10. The apparatus as recited in claim 9, further comprising an exclusive-OR (XOR) gate coupled between the serial flip-flop and the plurality of latches and configured to invert a polarity of the data bits dependent upon an inversion select signal.

11. A method comprising:
a sampling unit, in response to a serial clock signal, sampling an input serial data stream having even and odd data bits, providing an even serial data stream including the even data bits, and providing an odd serial data stream including the odd data bits;
a strobe generator generating a plurality of enable signals based upon the serial clock signal, wherein a frequency of a given enable signal is a fractional multiple of a frequency of the serial clock signal;
in response to a particular respective enable signal, each of a first portion of a plurality of latches latching and outputting a particular respective even data bit, and each of a second portion of the plurality of latches latching and outputting a particular respective odd data bit;
a plurality of output flip-flops, capturing and outputting the particular respective data bit output by the respective latch in response to an output clock signal.

12. The method as recited in claim 11, wherein the sampling unit comprises a first sampling device sampling the input serial data stream in response to a rising edge of the serial clock signal, and a second sampling device sampling the input serial data stream in response to a falling edge of the serial clock signal.

13. The method as recited in claim 11, further comprising a first serial flip-flop and a second serial flip-flop capturing and outputting the even data bits and the odd data bits, respectively, in response to a rising edge of the serial clock signal.

14. The method as recited in claim 13, further comprising a first exclusive-OR (XOR) gate inverting a polarity of the even data bits dependent upon an inversion select signal, and a second XOR gate inverting a polarity of the odd data bits dependent upon the inversion select signal.

15. A serializer-deserializer (SerDes) device comprising:
a receiver including:
a sampling unit configured to, in response to a serial clock signal, sample an input serial data stream having even and odd data bits, provide an even serial data stream including the even data bits, and provide an odd serial data stream including the odd data bits;
a strobe generator configured to receive the serial clock signal and to generate a plurality of enable signals based upon the serial clock signal, wherein a frequency of a given enable signal is a fractional multiple of a frequency of the serial clock signal;
a plurality of latches coupled to the sampling unit and configured to latch the even data bits and the odd data bits;
wherein in response to a particular respective enable signal, each of a first portion of the plurality of latches is configured to latch and output a particular respective even data bit, and each of a second portion of the plurality of latches is configured to latch and output a particular respective odd data bit;
a plurality of output flip-flops, each coupled to a respective latch and configured to capture and output the particular respective data bit output by the respective latch in response to an output clock signal.

16. The SerDes device as recited in claim 15, wherein the serial clock signal has an operating frequency that is slower than a baud rate of the input serial data stream.

17. The SerDes device as recited in claim 15, further comprising a clock generator configured to generate the output clock to have a frequency that corresponds to a fractional multiple of the frequency of the serial clock signal.

18. The SerDes device as recited in claim 15, wherein the sampling unit comprises a first sampling device and a second sampling device, wherein the first sampling device is configured to sample the input serial data stream in response to a rising edge of the serial clock signal, and wherein the a second sampling device is configured to sample the input serial data stream in response to a falling edge of the serial clock signal.

19. The SerDes device as recited in claim 15, further comprising a first serial flip-flop and a second serial flip-flop configured to capture and output the even data bits and the odd data bits, respectively, in response to a rising edge of the serial clock signal.

20. The SerDes device as recited in claim 19, further comprising a first exclusive-OR (XOR) gate coupled between the first serial flip-flop and the first portion of the plurality of latches and configured to invert a polarity of the even data bits dependent upon an inversion select signal, and a second XOR gate coupled between the second serial flip-flop and the second portion of the plurality of latches and configured to invert a polarity of the odd data bits dependent upon the inversion select signal.

* * * * *